(12) United States Patent
Gerhard

(10) Patent No.: US 8,411,251 B2
(45) Date of Patent: Apr. 2, 2013

(54) OPTICAL ELEMENT AND ILLUMINATION OPTICS FOR MICROLITHOGRAPHY

(75) Inventor: Michael Gerhard, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 709 days.

(21) Appl. No.: 12/413,170

(22) Filed: Mar. 27, 2009

(65) Prior Publication Data

US 2009/0201481 A1  Aug. 13, 2009

Related U.S. Application Data

(63) Continuation of application No. PCT/EP2007/011227, filed on Dec. 20, 2007.

(30) Foreign Application Priority Data

Dec. 28, 2006 (DE) .................. 10 2006 061 711
May 18, 2007 (DE) .................. 10 2007 023 411

(51) Int. Cl.
*G03B 27/54* (2006.01)
*G03B 27/42* (2006.01)

(52) U.S. Cl. .................................. 355/67; 355/53
(58) Field of Classification Search ............ 355/52, 355/53, 55, 67–71; 359/649
See application file for complete search history.

(56) References Cited

U.S. PATENT DOCUMENTS

| | | |
|---|---|---|
| 4,655,555 A | 4/1987 | Maechler et al. |
| 5,003,567 A | 3/1991 | Hawryluk et al. |
| 5,212,588 A | 5/1993 | Viswanathan et al. |
| 5,343,489 A | 8/1994 | Wangler |
| 5,581,605 A | 12/1996 | Murakami et al. |
| 5,615,047 A | 3/1997 | Komatsuda et al. |
| 5,686,728 A | 11/1997 | Shafer |
| 5,812,309 A | 9/1998 | Thoma et al. |
| 5,815,310 A | 9/1998 | Williamson |
| 6,033,079 A | 3/2000 | Hudyma |
| 6,069,739 A | 5/2000 | Borodovsky et al. |
| 6,195,201 B1 | 2/2001 | Koch et al. |
| 6,198,793 B1 | 3/2001 | Schultz et al. |
| 6,240,158 B1 | 5/2001 | Oshino |
| 6,244,717 B1 | 6/2001 | Dinger |
| 6,359,678 B1 | 3/2002 | Ota |
| 6,452,661 B1 | 9/2002 | Komatsuda |
| 6,512,641 B2 | 1/2003 | Omura |
| 6,549,270 B1 | 4/2003 | Ota |
| 6,658,084 B2 | 12/2003 | Singer |
| 6,710,917 B2 | 3/2004 | Mann et al. |

(Continued)

FOREIGN PATENT DOCUMENTS

| | | |
|---|---|---|
| DE | 33 43 868 | 6/1985 |
| DE | 41 24 311 | 1/1993 |

(Continued)

OTHER PUBLICATIONS

U.S. Appl. No. 60/774,850, filed Feb. 17, 2006.

(Continued)

*Primary Examiner* — Hung Henry Nguyen
(74) *Attorney, Agent, or Firm* — Fish & Richardson P.C.

(57) ABSTRACT

The disclosure relates to an optical element and illumination optics for microlithography. The optical element can be configured to influence a nominal beam angle, preset over a beam cross-section, of a radiation beam hitting the optical element. Moreover, the disclosure relates to an illumination optics for the microlithography with at least one such optical element and an illumination system for the microlithography with such an illumination optics.

19 Claims, 10 Drawing Sheets

U.S. PATENT DOCUMENTS

| | | | |
|---|---|---|---|
| 6,750,948 B2 | 6/2004 | Omura | |
| 6,867,913 B2 | 3/2005 | Mann et al. | |
| 6,894,834 B2 | 5/2005 | Mann et al. | |
| 7,847,921 B2 * | 12/2010 | Gruner et al. | 355/71 |
| 2001/0038446 A1 | 11/2001 | Takahshi | |
| 2001/0052969 A1 | 12/2001 | Von Bunau et al. | |
| 2002/0136351 A1 | 9/2002 | Singer | |
| 2002/0171047 A1 | 11/2002 | Braat | |
| 2004/0070740 A1 | 4/2004 | Irie | |
| 2004/0114217 A1 | 6/2004 | Mann et al. | |
| 2004/0119961 A1 | 6/2004 | Singer et al. | |
| 2004/0165282 A1 | 8/2004 | Sunaga et al. | |
| 2004/0252358 A1 | 12/2004 | Kawahara et al. | |
| 2005/0237623 A1 | 10/2005 | Fiolka et al. | |
| 2007/0285644 A1 * | 12/2007 | Brotsack et al. | 355/67 |
| 2008/0192359 A1 * | 8/2008 | Sohmer et al. | 359/649 |
| 2009/0021715 A1 * | 1/2009 | Deguenther et al. | 355/67 |
| 2011/0273791 A1 | 11/2011 | Mann et al. | |

FOREIGN PATENT DOCUMENTS

| | | |
|---|---|---|
| DE | 195 20 563 | 12/1996 |
| DE | 198 12 803 | 10/1999 |
| EP | 1 069 448 A1 | 1/2001 |
| EP | 1 093 021 | 4/2001 |
| EP | 1 199 590 | 4/2002 |
| EP | 1 225 481 | 7/2002 |
| EP | 1 367 442 | 12/2003 |
| EP | 1 434 093 | 6/2004 |
| EP | 1 450 196 | 8/2004 |
| JP | 3-041328 | 2/1991 |
| JP | 11-110791 | 4/1999 |
| JP | 2001-185480 | 7/2001 |
| JP | 2003-114387 | 4/2003 |
| TW | 476943 | 2/2002 |
| TW | 226938 | 1/2005 |
| WO | WO 03/029875 | 4/2003 |
| WO | WO 2004/010224 | 1/2004 |
| WO | WO 2005/015314 | 2/2005 |
| WO | WO 2005/083512 | 9/2005 |
| WO | WO 2006/084478 | 8/2006 |
| WO | WO 2007/093433 | 8/2007 |

OTHER PUBLICATIONS

Certified English Translation of U.S. Appl. No. 60/823,296, filed Aug. 23, 2006.
Certified English Translation of German Patent Application 10 2006 042 452.2, filed on Sep. 9, 2006.
Bal, Matthieu Frédéric, dissertation "Next-Generation Extreme Ultraviolet Lithographic Projection Systems", Feb. 10, 2003.
R. Hudyma, "An Overview of Optical Systems for 30nm Resolution Lithography at EUV Wavelengths," Proceedings of SPIE, vol. 4832, Dec. 2002, pp. 137-148.
European Search Report for EP Application No. 05 819 425.9-2217, dated Jun. 23, 2008.
English translation of Korean Office Action for corresponding KR Application No. 10-2010-7020467, dated Apr. 20, 2012.

* cited by examiner

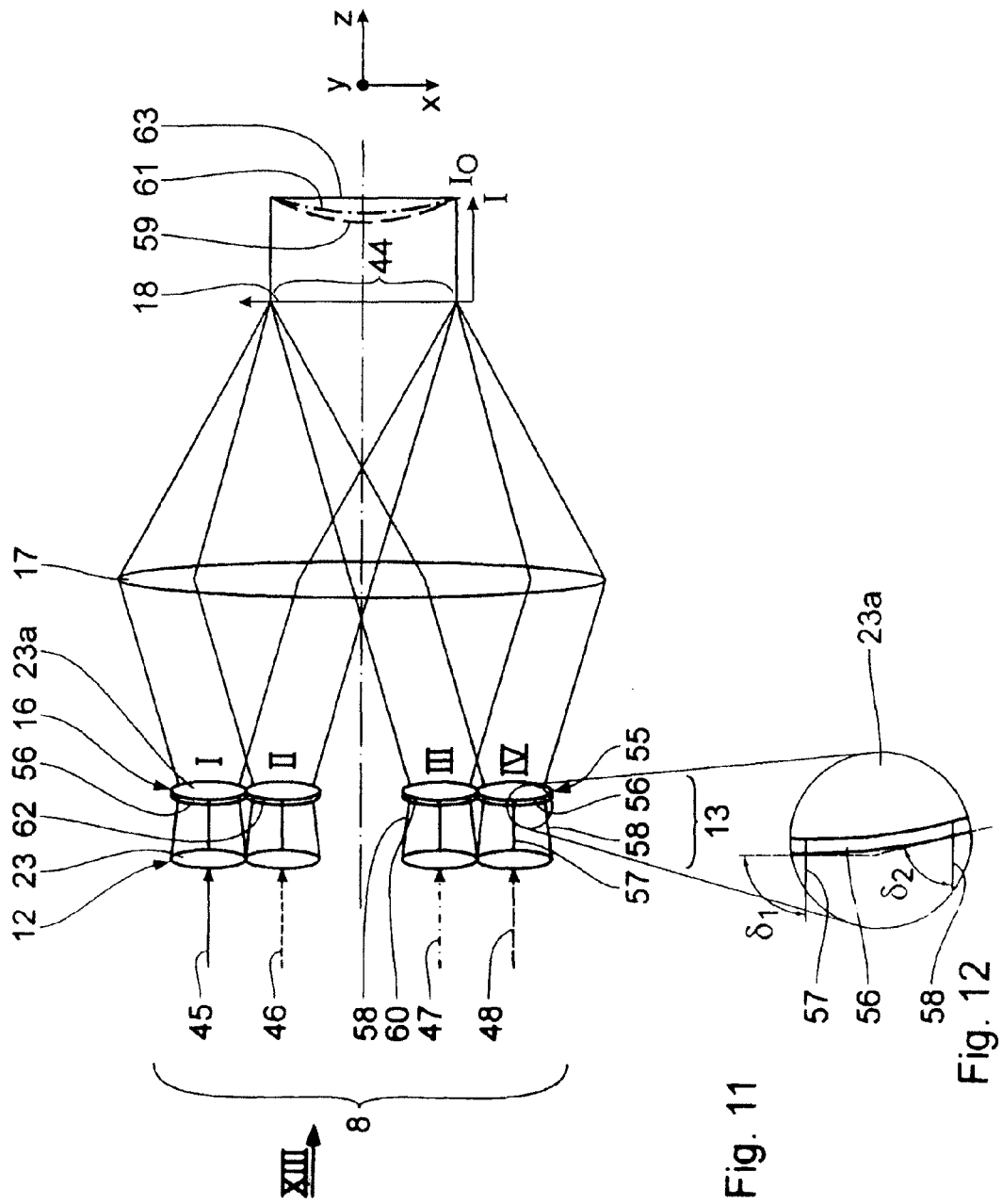

US 8,411,251 B2

OPTICAL ELEMENT AND ILLUMINATION OPTICS FOR MICROLITHOGRAPHY

CROSS-REFERENCE TO RELATED APPLICATIONS

This application is a continuation of, and claims benefit under 35 USC 120 to, International Application No. PCT/EP2007/011227, filed on Dec. 20, 2007. International Application No. PCT/EP2007/011227 claims benefit of International Application No. PCT/EP2007/001362, filed Feb. 16, 2007, and German Application Nos. 10 2006 061 711.8, filed Dec. 28, 2006, and 10 2007 023 411.4, May 18, 2007. International application No. PCT/EP2007/011227 is hereby incorporated by reference.

FIELD

The disclosure relates to an optical element and illumination optics for microlithography. The optical element can be configured to influence a nominal beam angle, preset over a beam cross-section, of a radiation beam hitting the optical element. Moreover, the disclosure relates to an illumination optics for the microlithography with at least one such optical element and an illumination system for the microlithography with such an illumination optics.

BACKGROUND

Optical elements for influencing a nominal beam angle preset over a beam cross-section, such as diffractive or refractive optical raster elements, are known. In many instances, an extensive effort is involved to produce spatial optical structures of such optical elements for adjusting the influence on the beam angle over the beam cross-section.

SUMMARY

In some embodiments, the disclosure provides an optical element that can influence the nominal beam angle in a preset manner whilst ensuring a lower manufacturing effort, or to develop the optical element in a way as to allow the nominal beam angle to be influenced in a new manner not accessible with known mechanisms.

Applicants discovered that considering the optical effects of a spatial optical structure of the optical element combined with those of an optical coating of the optical element can either reduce the desired properties with respect to the spatial optical structure, or lead to new possibilities in terms of influencing the nominal beam angle adjustable via the optical element. This can reduce the effort involved for the production of the spatial optical structure. Depending on the design of the optical element being provided with the spatial structure and the optical coating, the nominal beam angle over the beam cross-section of the radiation beam may be influenced in a way that has previously been impossible to obtain via an uncoated spatial optical structure. When using the optical element in an illumination optics of a projection exposure apparatus for the microlithography, for example, this can enable both the illumination angle distribution in an illumination field of a reticle plane and the field distribution of the intensity in this illumination field to be determined in an accurate and defined manner so as to meet demanding tolerance limits. The illumination angle distribution is then for example preset via a pupil-defined element (PDE) designed, i.e. being provided with a spatial optical structure as well as an optical coating. The intensity distribution is for example preset via a field-defined element (FDE) designed. Both the PDE and the FDE may be designed in accordance with the disclosure. Alternatively, it is also conceivable that only one of these elements is designed. The optical element may also advantageously be used in other applications in which a particular far field distribution is to be obtained. The spatial optical structure may be designed in a self-supporting manner or applied on a carrier layer. The optical coating may be applied on the spatial optical structure itself or, if a carrier layer is available, on the carrier layer. The spatial optical structure may be applied either on the incident side or on the emission side or on both the incident and emission side of the optical element. In principle, the optical element is applicable for radiation beams of any wavelength. The optical element can provide particular advantages when used in the UV and DUV ranges, such as between 120 and 300 nanometers.

Depending on the desired properties to be met when influencing the nominal beam angle, a diffractive optical structure can be advantageous. Diffractive optical structures generally involve less material, which is of advantage in terms of the wavelength of the incident radiation beam in case of a potential residual absorption of the optical element.

An interference coating can provide the possibility to avoid sudden transmission changes as a function of the incidence angle of rays of the radiation beam hitting the optical coating. This way, the optical coating may for example be designed as an angle-edge filter which enables rays of the radiation beam to pass through the coating within a certain beam-angle range only, and otherwise does not allow radiation to pass through.

By designing the optical coating as a raster element, individual channels of the radiation beam may be influenced in a defined manner. This procedure of influencing individual channels may be such that all channels are influenced in the same way. Alternatively, it is conceivable to arrange the raster elements in groups of coherent areas, with the result that certain areas of the optical element have a different optical effect on the radiation beam than other areas. This enables the radiation beam to be selectively influenced by arranging raster elements with different optical effects in an adequate manner.

A raster element design can result in an optical element having only minor differences in terms of the optical effects of adjacent raster elements. The difference in attenuation of adjacent raster elements may for example be smaller by a factor of 10 or 100 as compared to the difference between the maximal and minimal attenuation within the same raster element. This may be used to create optical elements in which the optical properties are distributed along the cross-section of the optical element in a virtually continuous manner, which is particularly useful for FDE elements. Alternatively, in case of greater differences in attenuation of adjacent raster elements, the raster elements may be designed in a way as to obtain gradual or other discontinuous distributions of the optical properties.

An optical coating designed as a correction coating may correct production-related imperfections in terms of the influence on the beam angle or far field distribution, respectively, generated by the un-coated spatial optical structure.

A far-field effect of the optical element can allow for a desired plateau to be obtained in at least an area of the far field. In this plateau area, the optical element causes the emission beam angle of a parallel incident radiation beam to split in a uniform manner. A plateau is obtained if the optical coating causes the variation in the far field distribution of the uncoated spatial optical structure to be reduced in the observed area of the far field by a factor of at least 5 (e.g., a factor of at least 10). A constant total far field distribution can be constant in a variation range of ±1%.

An optical coating can remove unwanted peaks at the edge of the far field distribution. Such far-field peaks, so-called overshoots, may occur in diffractive or refractive optical structures, such as in raster elements, as a result of the production.

An optical coating may be used to remove a zero-order peak of an unwanted excessive intensity, a so-called hot spot. Such peaks may also occur in diffractive or refractive optical elements, such as in raster elements, as a result of the production. Radiation below the preset divergence angle limit is virtually completely absorbed or reflected.

In some embodiments, the disclosure provides an illumination optics for the microlithography with at least one angle-presetting element and at least one field-presetting element as well as an illumination system provided with such an illumination optics.

The advantages of an illumination optics and such an illumination system can correspond to those as discussed above in terms of the optical element according to the disclosure.

BRIEF DESCRIPTION OF THE DRAWINGS

The following is a detailed description of exemplified embodiments of the disclosure, taken in conjunction with the drawing, in which

FIG. 11 shows a more detailed view of four channels of a two-stage raster arrangement in the shape of a raster module, with a second stage of the raster arrangement being designed as an optical element having a spatial optical structure and an optical coating, and whose optical effects combine to form a radiation beam hitting individual channels of the optical element for adjusting the influence on the nominal beam angle;

FIG. 12 shows an enlarged section of FIG. 11 in the area of the coating of a raster element of the raster arrangement;

DETAILED DESCRIPTION

Figure 1:
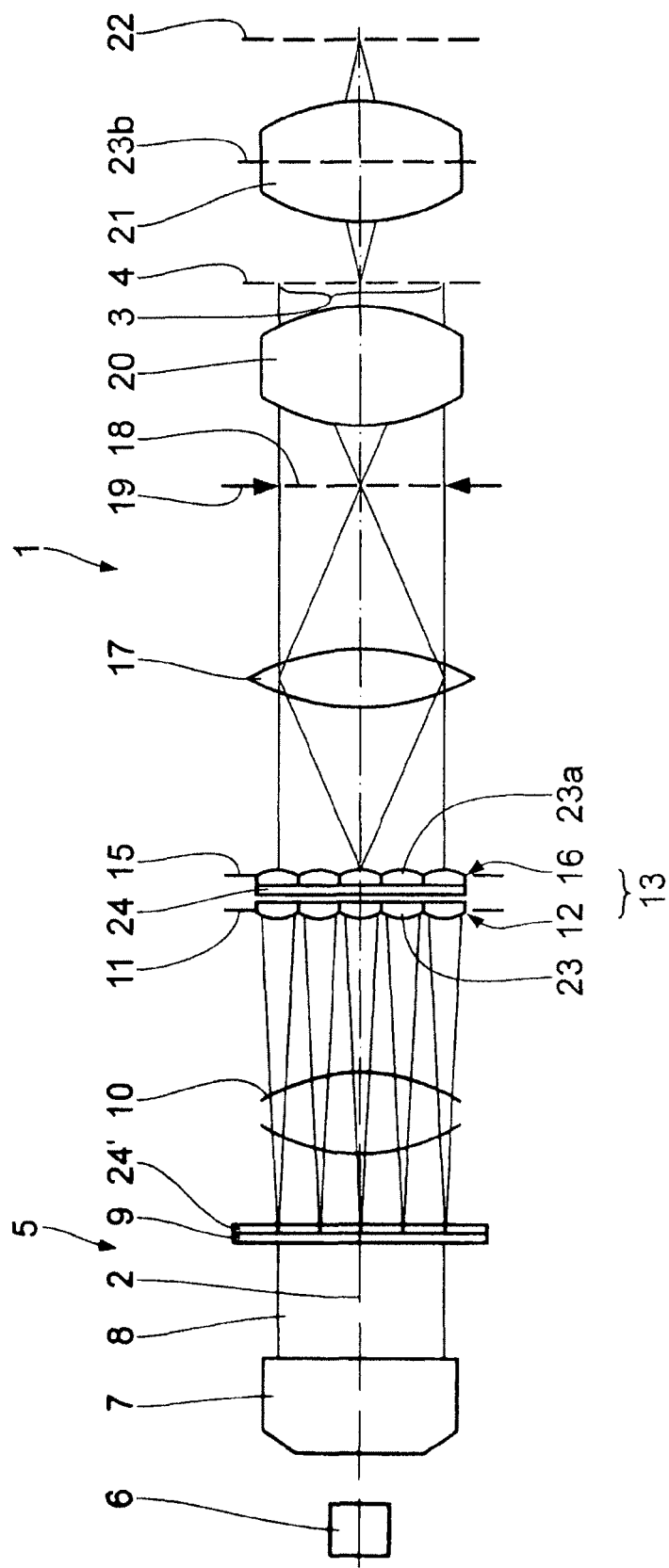
FIG. 1 shows a schematic meridional section of an illumination system in a projection exposure apparatus for the microlithography.

FIG. 1 shows a schematic view of a projection exposure apparatus for the microlithography 1 which is designed as a wafer scanner and used for the production of semiconductor components and other finely structured components. The projection exposure apparatus 1 uses light in particular from the vacuum ultraviolet range (VUV) so as to obtain resolutions of up to fractions of micrometers. A scanning direction of the projection exposure apparatus 1 extends vertically to the drawing plane of FIGS. 1 and 2. In the meridional section shown in FIG. 1, all optical components of the projection exposure apparatus 1 are arranged in a row along an optical axis 2. It is understood that the optical axis may also be randomly convoluted, in particular to obtain a compactly designed projection exposure apparatus 1.

An illumination system, the entirety of which is referred to as 5, of the projection exposure apparatus 1 serves for the defined illumination of an object field or illumination field, respectively, 3 in a reticle plane 4, with a structure—in the shape of a reticle not further described—to be transferred being disposed therein. An $F_2$-laser with a working wavelength of 157 nm and whose illumination light beam is aligned coaxially with the optical axis 2 is used as a primary light source 6. Other UV light sources, such as an ArF excimer laser with a working wavelength of 193 nm, a Krf excimer laser with a working wavelength of 248 nm as well as primary light sources with higher or lower wavelengths, are also conceivable.

The light beam, which has a small rectangular cross-section, is emitted by the light source 6 and initially hits a beam expansion optics 7 which generates an emitted beam 8 with more or less parallel light and a larger rectangular cross-section. The beam expansion optics 7 may contain elements which are used for the reduction of coherence of the illumination light. More or less parallelized via the beam expansion optics 7, the laser light subsequently hits a diffractive optical element (DOE) 9 which is configured as a computer-generated hologram for generating an illumination light angle distribution. The DOE 9 serves to preset an influence on the nominal beam angle over the beam cross-section of the radiation beam 8 when hitting the DOE 9. When passing through a Fourier lens arrangement or a condenser 10, respectively, which is positioned away from the DOE 9 at a distance defined by its focal length, the angle distribution generated by the DOE 9 is converted into a two-dimensional, i.e. a position-dependent illumination light intensity distribution which is perpendicular to the optical axis 2. The intensity distribution thus generated is therefore present in a first illumination plane 11 of the illumination system 5. The DOE 9, in conjunction with the condenser 10, thus forms an illumination distribution device for generating a two-dimensional illumination light intensity distribution.

A first raster arrangement 12 of a raster module 13, which is also referred to as a honeycomb condenser, is disposed in the area of the first illumination plane 11. The raster module 13 serves to generate a defined intensity and illumination angle distribution of the illumination light.

A second raster arrangement 16 is arranged in another illumination plane 15 which is a Fourier-transformed plane with regard to the illumination plane 11. The two raster arrangements 12, 16 form the honeycomb condenser 13 of the illumination system 5. The other illumination plane 15 is a pupil plane of the illumination system 5.

Another condenser 17, which is also referred to as a field lens, is arranged downstream of the raster module 13. The condenser 17, in conjunction with the second raster arrangement 16, images the illumination plane 11 in an intermediate field plane 18 of the illumination system 5. A reticle masking system (REMA) 19 serving as a movable shadowing diaphragm for generating a sharp edge of the illumination light intensity distribution may be disposed in the intermediate field plane 18. An objective 20 disposed therebehind images the intermediate field plane 18 onto the reticle, i.e. the lithography template, disposed in the reticle plane 4. A projection objective 21 is used to image the reticle plane 4 into a wafer plane 22 and onto the wafer not shown in FIG. 1 which is moved along the scanning direction in an intermittent or continuous manner. The first raster arrangement 12 has individual first raster elements 23 which are arranged in columns and rows. The first raster elements 23 have a rectangular aperture with an x/y aspect ratio (y: scanning direction) of for example 2:1. Other, in particular larger aspect ratios of the first raster elements 23 are conceivable, too.

The meridional section can extend along a raster gap. The first raster elements 23 are in particular configured as microlenses having for example a positive refractive power. The rectangular shape of the first raster elements 23 corresponds to the rectangular shape of the illumination field 3. The first raster elements 23 are disposed directly adjacent to each other in a raster corresponding to their rectangular shape, thus substantially filling the area. The first raster elements 23 are also referred to as field honeycombs. Two raster elements 23a of the second raster arrangement 16, with each of which being assigned to raster channels of the raster module 13, are disposed in the light path behind the first raster elements 23 of the first raster arrangement. The second raster elements 23a are also configured as micro-lenses which have in particular a positive refractive power and are also referred to as pupil honeycombs which are disposed in the illumination plane 15, i.e. in a pupil plane of the illumination system 5. The illumination plane 15 is conjugated to a pupil plane 23b of the projection objective 21.

As will be described below, the two raster arrangements 12, 16 are used as a spatial optical structure which, when exposed to the radiation beam 8, generates a first part of an influence exerted on the nominal beam angle of the radiation beam 8. The second raster arrangement 16 is provided with an optical coating 24 on the incident side. As will be described in more detail below, the optical effect of the optical coating 24 is such that an exposure to the radiation beam 8 results in a defined attenuation of parts of its beam cross-section, thus generating a second part of the amount of influence on the beam angle. The optical effects of the second raster arrangement 16 and the optical coating 24 are such that they complement each other in influencing the nominal beam angle. The DOE 9 is also provided with an optical coating 24' on its emission side, the optical coating 24' combining with the spatial optical structure of the DOE 9 to achieve a corresponding influence on the nominal beam angle.

Figure 2:
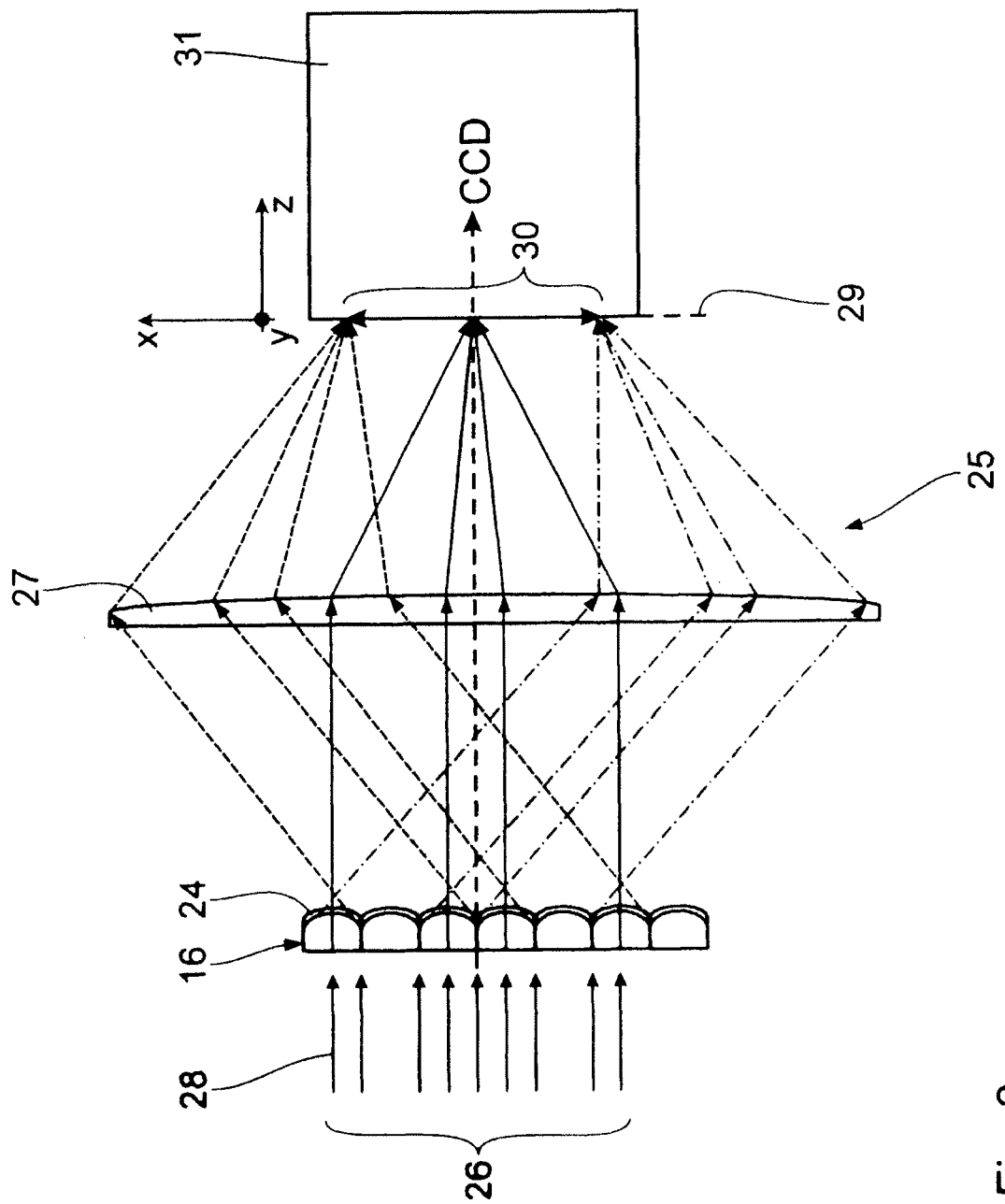
FIG. 2 shows a schematic meridional section of a measuring arrangement for measuring a far field distribution of an optical element of the illumination system.

Using the example of the second raster arrangement 16 provided with an optical coating on, in this case, the emission side, FIG. 2 shows a measuring arrangement 25 for measuring the influence exerted by an optical element on the nominal beam angle of a test radiation beam 26, the optical element on the one hand being provided with a spatial optical structure which contributes to the influence exerted on the nominal beam angle, and on the other hand with an optical coating 24 contributing thereto. A Fourier lens 27 disposed downstream of the second raster arrangement 16 converts the two-dimensional beam angle distribution, generated in a measuring plane 29 from parallel individual rays 28 of the test radiation beam 26 via the optical element 16, 24, into a two-dimensional intensity distribution. The larger the deviation angles the individual rays 28 are subject to, the larger their distance to the centre of a measuring field 30 in the measuring plane 29. A CCD array 31 is disposed in the measuring field 30. The result of the measurement in the measuring field 30 obtained with the measuring arrangement 25 is referred to as the far field distribution of the optical element 16, 24.

FIG. 2 is provided with a Cartesian xyz coordinate system illustrating the relative positions. The x-direction extends upwards in FIG. 2, the y-direction extends towards the viewer and is perpendicular to the drawing plane, and the z-direction extends to the right in FIG. 2. The coordinate origin (x=0, y=0) is located at the centre of the measuring field 30.

Figure 3:
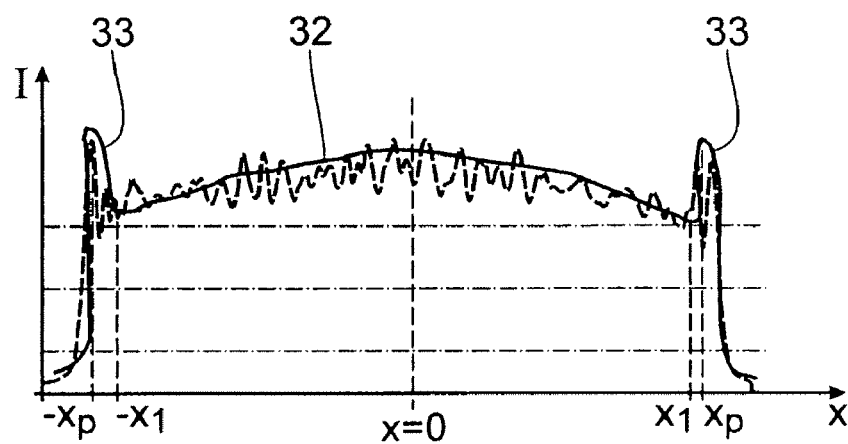
FIG. 3 shows a structure far field distribution of a spatial optical structure of the optical element.
Figure 4:
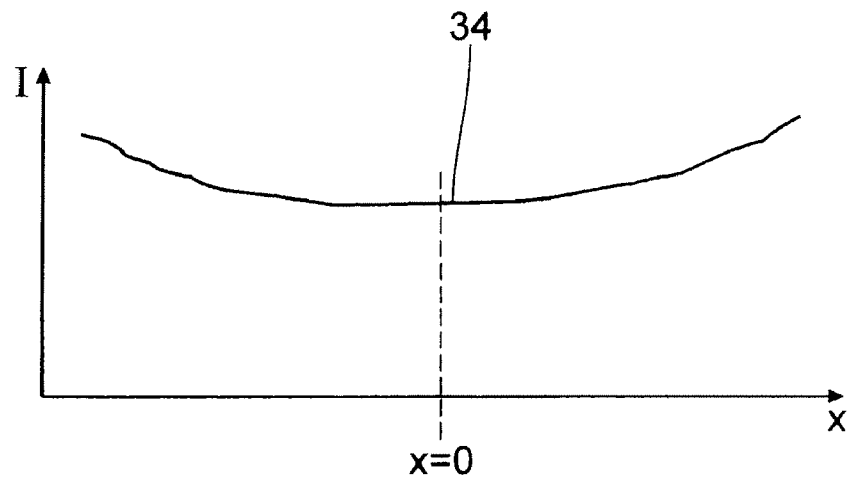
FIG. 4 shows a coating far field distribution of an optical coating of the optical element.
Figure 5:
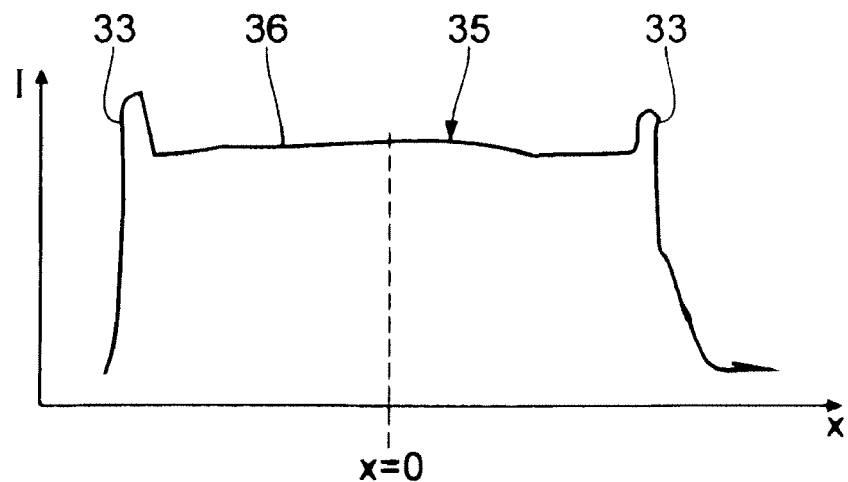
FIG. 5 shows a total far field distribution of the optical element which is provided with the spatial optical structure and the optical coating.

FIGS. 3 to 5 show on the one hand the optical effects of the spatial optical structure 16, and on the other hand those of the coating 24. FIG. 3 only shows the optical effect of the spatial optical structure 16, i.e. without the optical coating 24. The intensity I measured by the CCD array 31 is shown as a function of the x-coordinate, i.e. a structure far field distribution 32.

The structure far field distribution 32 is mirror-symmetric with respect to the yz plane and rotation-symmetric with respect to the z-axis through the coordinate origin. There is a local maximum at x=0, y=0. At larger absolute x- and y-values, the structure far field distribution 32 initially drops off, with the structure far field distribution 32 near x=0, y=0 thus obtaining shape of a dome. At the edges, i.e. in the direction of large x- and y-values, the structure far field distribution 32 has a characteristic peak 33, also referred to as an overshoot, on either side. The peaks 33 occur at $x_p$ and at $-x_p$.

At positions $\pm X_1$, the intensity allowed to pass through amounts to approximately 60% of a scale value. At the position x=0, the intensity allowed to pass through amounts to approximately 75% of the scale value. Therefore, the intensity at $\pm x_1$ and the intensity at x=0 differ by more than 10%.

FIG. 4 only shows the optical effect of the optical coating 24, i.e. without the effect of the spatial optical structure 16. FIG. 4 thus shows a coating far field distribution 34. The latter is determined by measuring the spatial optical structure 16 once without the optical coating 24 (cp. FIG. 3) and once with the optical coating 24 (cp. FIG. 5), with the structure effect subsequently being deducted from these two measurements. Alternatively, the coating far field distribution 34 may often be determined by applying the optical coating 24 on a plane substrate having no optical effect.

The coating far field distribution 34 is rotation-symmetric about the z-axis about the coordinate origin. It has a global minimum at x=0 and rises steadily when the absolute x-values are increased, i.e. in the +x- and −x-directions. The curvature of the coating far field distribution 34 thereby corresponds to that of the structure far field distribution 32 in the area between the peaks 33.

FIG. 5 shows the combined optical effect of the spatial optical structure 16 and the optical coating 24. FIG. 5 shows a total far field distribution 35. Due to the compensating curvatures of the far field distributions 32, 34, the total far field distribution 35 has a plateau 36 between the peaks 33. In terms of the total far field distribution 35, the difference between the maximal and minimal intensity between the peaks 33 is much smaller, e.g. by a factor of 2, by a factor of 5 or by a factor of 10, than the difference between the maximal and minimal intensity between the peaks 33 of the structure far field distribution 32. On the whole, the spatial optical structure 16 with the optical coating 24 thus generates a much more uniform angle distribution of the test radiation beam 26 and, consequently, a defined influence on the nominal beam angle of the radiation beam 8 when the projection exposure apparatus 1 is used.

The optically effective coating 24', which may alternatively or additionally be applied on the DOE 9 of the projection exposure apparatus 1, has a corresponding effect. In the following, embodiments of the optical coating 24 are described which are also applicable to the optical coating 24' in this or corresponding ways.

Figure 6:
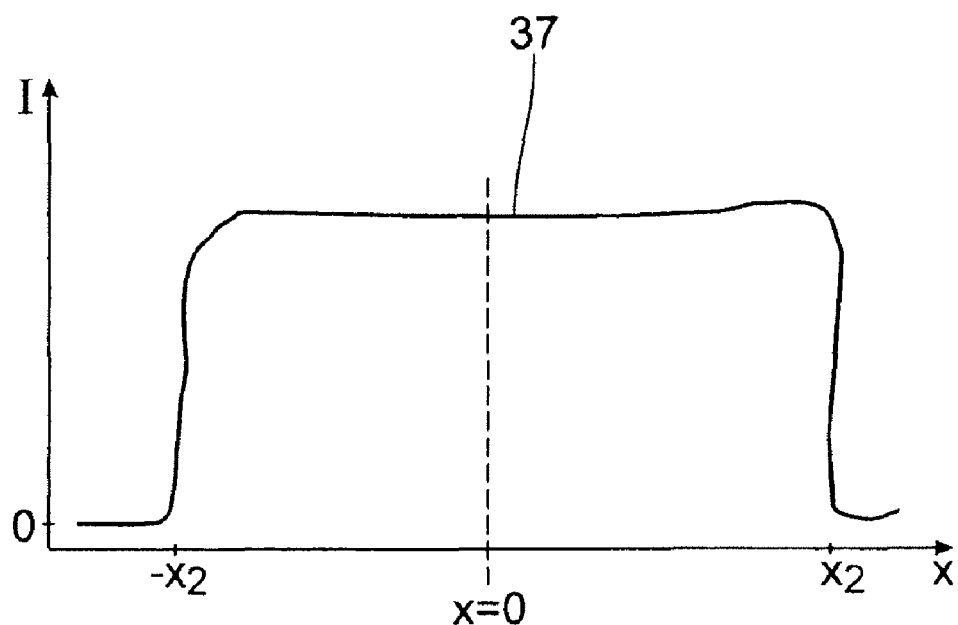
FIG. 6 shows a coating far field distribution of an optical coating for an optical element of the illumination system.
Figure 7:
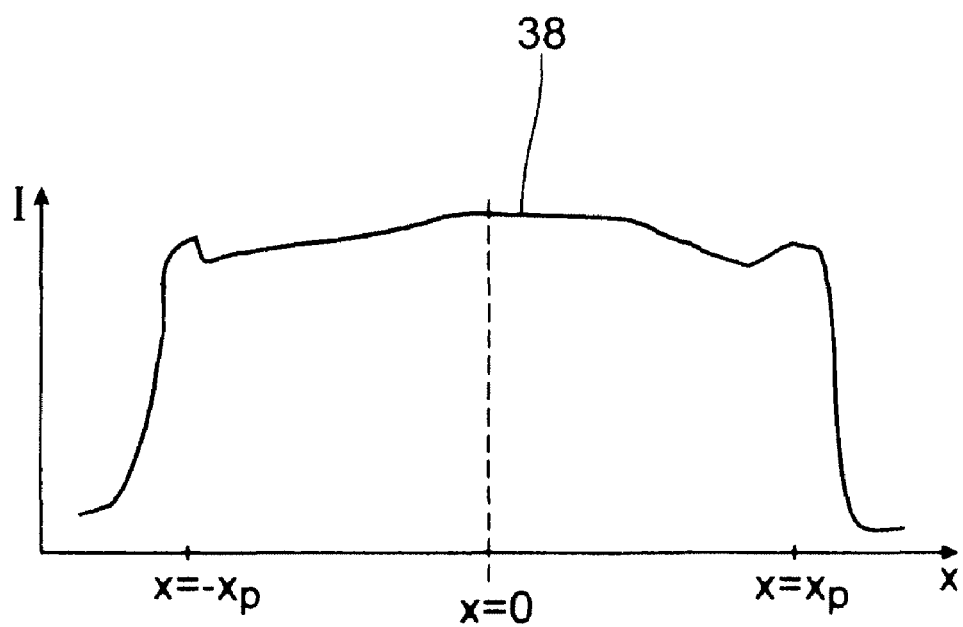
FIG. 7 shows a total far field distribution of the optical element provided with the coating with the far field distribution according to FIG. 6 with the far field distribution according to FIG. 3.

FIGS. 6 and 7 show the optical effect of the optical coating 24. The optical coating according to the FIGS. 6 and 7 acts as a beam-angle bandpass. The individual rays 28 (compare FIG. 2) emitting from the spatial optical structure 16 may only pass through the optical coating up to a maximum deflection angle. Consequently, as shown in FIG. 6, a coating far field distribution 37 is obtained which is rotation-symmetric about the z-axis through the coordinate origin and has an intensity, measured by the CCD array 31, which drops steeply at $x=x_2 \approx x_p$ and at $x=-x_2 \approx -x_p$.

FIG. 7 shows, corresponding to FIG. 5, a total far field distribution 38 with the optical coating according to FIG. 6 acting as a beam-angle bandpass. Since at $x=\pm x_p$, individual rays 28 may pass through the optical coating 24 only to a very low extent, the peaks 33 of the total far field distribution are considerably reduced. The minimum intensity at $\pm x_p$ approximately equals the maximum intensity at x=0. On the whole, the optical element 16, 24 with the optical effect according to FIG. 7, i.e. with the optical bandpass coating 24, results in a very uniform angle distribution of the deviation angles of the individual rays 28 of the test radiation beam 26. An equally homogeneous optical effect is obtained when this optical element 16. 24 is used in the projection exposure apparatus 1.

Figure 8:
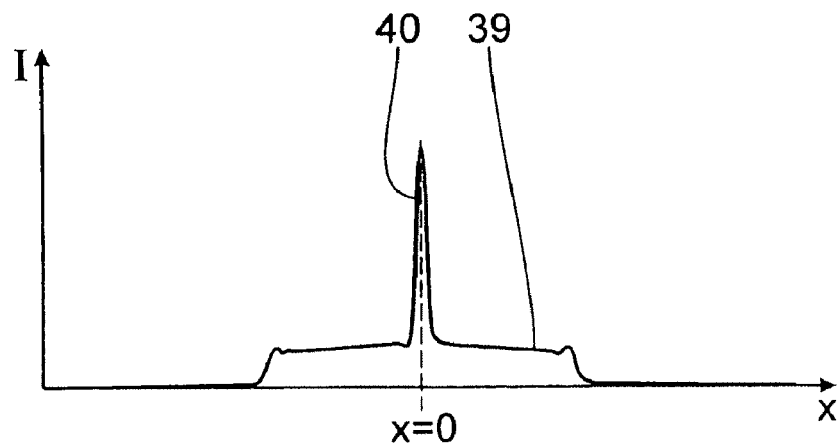
FIG. 8 shows a structure far field distribution of a honeycomb raster element of a spatial optical structure of an optical element for the illumination system.
Figure 9:
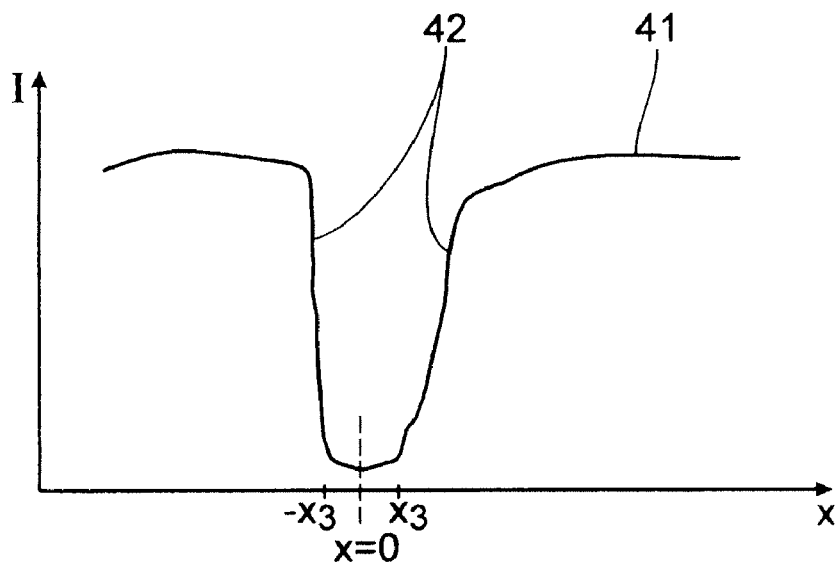
FIG. 9 shows a coating far field distribution of an optical coating of the optical element.
Figure 10:
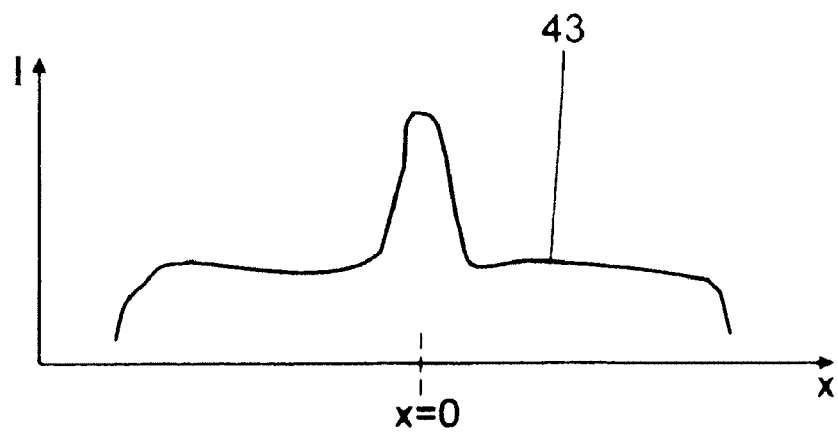
FIG. 10 shows a total far field distribution of the optical element provided with the coating with the far field distribution according to FIG. 9 and the spatial optical structure with the far field distribution according to FIG. 8.

FIGS. 8 to 10 illustrate, in a representation similar to that of FIGS. 3 and 5, the optical effect of an optical element with a spatial optical structure 16 and an optical coating 24. FIG. 8 shows a structure far field distribution 39. In such embodiments, the corresponding spatial optical structure 16 is a diffractive optical element which shows a sharp zero-order maximum, a so-called hot spot 40, at a deviation angle of 0°. In such embodiments of the spatial optical structure 16, raster elements are configured as hexagonal raster honeycombs. The maximum intensity at the hot spot 40 is approximately eight times the intensity of the structure far field distribution 39 adjoining the hot spot 40 at larger absolute x-values. Corresponding to the structural symmetry of the raster honeycombs of this embodiment of the spatial optical structure 16, the structure far field distribution has rotational symmetry of order 6 with respect to the z-axis running through the coordinate origin.

FIG. 9 shows the optical effect of an optical coating 24 configured as an angle-edge filter. A coating far field distribution 41 is shown. The latter is rotation-symmetric about the z-axis running through the coordinate origin and has a sharp minimum at x=0, with the x-dimensions of the sharp minimum being complementary to the hot spot 40. Edges 42 of this minimum can be found at x-values $\pm x_3$ where the flanks of the hot spot 40 are located. The edges 42 have such an effect that beam angles, which are generated by the spatial optical structure on which the edge-filter coating is applied, are absorbed or reflected by the edge filter coating if they are below a preset divergence angle limit $\pm x_3$.

FIG. 10 illustrates the combined effect of the spatial optical structure in conjunction with the structure far field distribution 39 according to FIG. 8 and the optical edge filter coating 24. A total far field distribution 43 is shown. The intensity of a residual intensity maximum at x=0 is still twice the intensity of the intensity plateau adjoining the intensity maximum at larger absolute x- and y-values. This results in a very homogeneous deflection angle distribution of this optical element as compared to the uncoated spatial optical structure.

The two raster arrangements 12, 16 do not require a monolithic design, as schematically indicated in FIG. 1, but may be divided into two elements arranged one behind the other in the beam path of the illumination light 8, with one of the two elements forming raster rows and the second of the two elements forming raster columns. The common effect of such an arrangement in columns and rows in terms of the effect of the spatial optical structure corresponds to the effect of the raster arrangements 12, 16 according to FIG. 1. In this case, the optical coating may also be applied on one of the two elements only, i.e. for example only on the row element or on the column element, with the optical effect of the coating thus contributing to the effect of the spatial optical structure of the respective carrier element.

FIG. 11 shows a raster module 13 of an optically effective element for influencing intensity contributions of the raster elements 23, 23a to the total illumination intensity across an illumination field 44. Components and reference quantities which correspond to those described previously with reference to the FIGS. 1 to 10 carry the same reference numerals and are not described again.

FIG. 11 shows four exemplified first raster elements 23 defining, from top to bottom, channels I to IV for illumination light bundles 45 to 48 of the illumination light 8. In this respect, the illumination light bundle 45 is assigned to channel I, the illumination light bundle 46 to channel II, the illumination light bundle 47 to channel III and the illumination light bundle 48 to channel IV. The real raster module 13 is provided with a much higher number of channels, for example with several hundreds of such channels. The second raster elements 23a of the second raster arrangement 16 are disposed in the light path behind the first raster elements 23 of the first raster arrangement 12, with each of the second raster elements 23a being assigned to a channel. Together with the field lens 17, the second raster elements 23a image the first raster elements 23 disposed in the illumination plane 11, i.e. the field honeycombs, into the illumination field 44 in the intermediate field plane 18. During this process, the images of the first raster elements 23 are superimposed in the intermediate field plane 18.

The optical element influencing the nominal beam angle of the illumination light beam 8 in FIG. 11 is configured as an optical variation coating 55 on the second raster elements 23a of the second raster arrangement 16. The variation coating 55 is applied on the side of the second raster arrangement 16 facing the first raster arrangement 12. A corresponding optical coating may also be provided on the emission side of the raster arrangement 12.

Each of the second raster elements 23a may be provided with an individual transmission coating. The transmission coatings are for example configured as interference coatings. The thickness of each of the transmission coatings may be finely adjusted via ion beam figuring (IBF).

The effect of one of the transmission coatings, strictly speaking of the transmission coating 56 of the second rater element 23a shown at the bottom of FIG. 11 (channel IV), is described below in conjunction with the enlarged section according to FIG. 12.

The illumination light bundle 48 of channel IV is focused by the first raster element 23 of channel IV in the direction towards the second raster element 23a of channel IV. A central ray 57 of the illumination light bundle 48 is not deflected by the first raster element 23 and thus hits the transmission coating 56 and the second raster element 23a from a vertical direction. An angle $\delta$, between the central ray 57 and a tangent to the point of incidence of central ray 57 on transmission coating 56 thus amounts to 90°.

Due to the curvature of the second raster element 23a, the angle $\delta_2$ between a marginal ray 58 of the illumination light bundle 48 and a tangent to the point of incidence of this marginal ray 58 on the transmission coating 56 is smaller than 90°. Thus, the effective optical path length of the central ray 57 propagating through the transmission coating 56 is smaller than the effective optical path length of the marginal ray 58 propagating through the transmission coating 56. The transmitting effect of the transmission coating 56 is thus different for marginal rays of the illumination light beam 48 than for the central ray 57. The transmission of the illumination light bundle 48 therefore depends on the point of incidence on the second raster element 23a. The transmission coating 56 thus completes the influence exerted by the raster module on the beam angle, i.e. of the raster arrangements 12, 16 on the radiation beam 8.

The coating thickness of the transmission coating 56 is the same on the entire second raster element 23a. This consistency of coating thickness across the respective second raster element 23a applies to the entire variation coating 55, although the individual second raster elements 23a may be provided with transmission coatings 56 of different coating thicknesses. In this case, the entire variation coating is designed in a way as to cause a maximum attenuation for a particular second raster element 23a and a minimum attenuation for another second raster element 23a.

The thickness of the transmission coating 56 is chosen to ensure that the transmission of the transmission coating 56 is lower for the central ray 57 than for the marginal rays 58. An intensity contribution of channel IV across the illumination field 44 in the intermediate field plane 18 is shown dashed in FIG. 11. The lowest intensity contribution 59 is obtained in the centre of the illumination field 44. The intensity contribution 59 increases continuously towards the edge of the illumination field 44 until the highest value $I_0$ is reached at the edge of the illumination field 44.

The effect of a transmission coating 60 on the second raster element 23a of channel III is illustrated in FIG. 11 by an intensity contribution 61 across the illumination field 44. The intensity contribution 61 is shown dash-dotted in FIG. 11. The transmission coating 60 of channel III has an effect which depends on the point of incidence on the second raster element 23a of channel III and corresponds to that of the transmission coating 56. The transmission coating 60, however, attenuates the central ray of the illumination light bundle 47 less than compared to the transmission coating 56, thus resulting in a lower absolute intensity variation in terms of the intensity contribution 61. The marginal rays 58 of channel III in turn are allowed to pass through at an intensity $I_0$.

The effect of a transmission coating 62 on the second raster element 23a of channel II is illustrated in FIG. 11 by an intensity contribution 63 across the illumination field 44. The transmission coating 62 is designed in a way that the illumination light bundle 46 is transmitted with the same intensity, no matter where its point of incidence is located on the transmission coating. Thus, the intensity contribution 63 is always $I_0$, no matter where on the illumination field 44.

In channel I, the second raster element 23a is again provided with a transmission coating 56 corresponding to the transmission coating 56 of channel IV. The illumination light bundle 45 is influenced by the raster module 13 according to FIG. 11 in exactly the same way as the illumination light bundle 48, with the illumination light bundle 45 thus yielding an intensity contribution across the illumination field 44 which equals the intensity contribution 59.

The different transmitting effects of the transmission coatings 56, 60 and 62 may be obtained via different coating thicknesses of the transmission coatings or by producing these transmission coatings from different materials. Different effects may also be obtained via different sequences of material in the transmission coatings, which are conventionally designed as multi-layer coatings.

Figure 13:
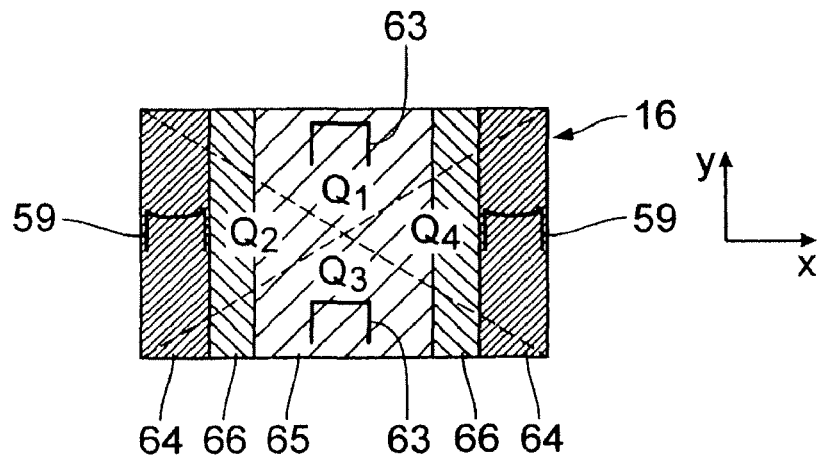
FIG. 13 shows a schematic view of the second stage of the raster module according to FIG. 11 seen from the viewing direction XIII in FIG. 11.

FIG. 13 shows a schematic plan view of the second raster arrangement 16 of the raster module 13 according to FIG. 11 with an exemplified distribution of raster elements 23a provided with the transmission coatings 56, 60, 62. Opposite edge strips 63 of the second raster arrangement 16 are designed with two raster elements 23a, with each of which being provided with transmission coatings whose optical effect corresponds to that of the transmission coating 56 of the channels I, IV according to FIG. 11. Each of the edge strips 62 is provided with a multitude of second raster elements 23a, i.e. a multitude of channels. The two edge strips 64 generate an intensity contribution across the illumination field 44 which, as indicated in FIG. 13, corresponds to the intensity contribution 59 according to FIG. 11 when multiplied by the number of channels in the edge strips 62. The two edge strips 64 extend along a scanning direction y of the projection exposure apparatus 1.

A central strip 65 extending between the two edge strips 64 is provided with second raster elements 23a whose transmission coatings have the same optical effect as the transmission coating 62 of channel II in FIG. 11. The central strip 65 is more than twice as wide as the edge strips 64. When multiplied by the number of channels in the central strip 65, the intensity contributions of the central strip 65 to the total intensity across the illumination field 44 correspond to the intensity contribution 63, as indicated in FIG. 13.

An intermediate strip 66 is disposed between each edge strip 64 and the central strip 65. The width of the intermediate strips 66, which also extend parallel to the scanning direction y, is lower than the width of the edge strips 64. The two intermediate strips 66 are designed with two second raster elements 23a whose transmission coatings have the same optical effect as the transmission coating 60 of channel III according to FIG. 11. The second raster elements 23a of the intermediate strips 66 thus contribute to the intensity across the illumination field 44 with intensity contributions 61.

The marginal illumination light bundles, i.e. for example the illumination light bundles 45 and 48 according to FIG. 11, result in an excess intensity in the marginal areas of the illumination field 44 and, subsequently, in the object field 3 in the reticle plane 4. This excess intensity may be used to correct or compensate for effects occurring in the illumination system 5 and/or in the projection objective 21.

Figure 14:
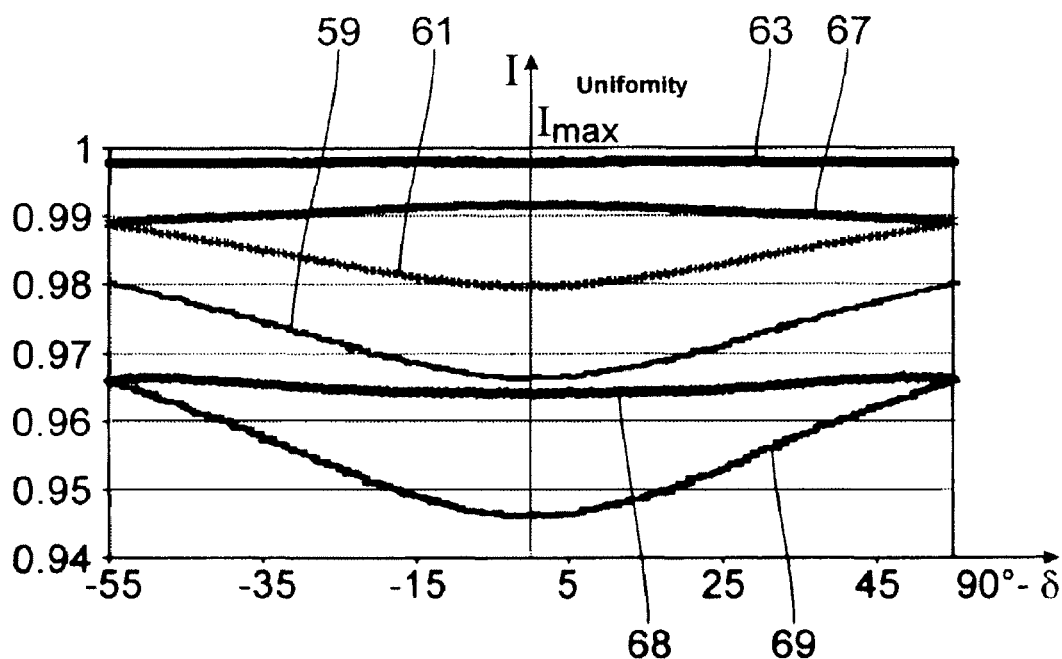
FIG. 14 shows a diagram illustrating the influence on the transmission of the raster element according to FIG. 12 caused by coatings of different thicknesses applied thereon, the diagram showing the transmission as a function of the incidence angle (90°-δ) when hitting the coated optical surface of the raster element.

FIG. 14 shows the intensity contribution, which depends on the position or angle of influence, respectively, for different coating thicknesses of transmission coatings of the variation coating 55.

The transmission coating is composed of a material or a sequence of material, respectively, which yields an intensity contribution of $I_{max}=1$ at a coating thickness of 75 nm of the transmission coating. A transmission coating with a coating thickness of 75 nm across the second raster element 23a may thus be used as a transmission coating 62 for the central strip 65.

The transmission coatings described below and the transmission coating just described differ from each other only in terms of their coating thicknesses.

A transmission coating with a constant coating thickness of 82 nm yields an intensity contribution which equals the intensity contribution 61 according to FIG. 11. With this 82 nm transmission coating, a transmission of 0.98 is obtained for the central ray 57. A transmission of 0.99 is obtained for the marginal rays 58. The 82 nm coating may be used as a coating for the second raster elements 23a of the intermediate strips 66.

A transmission coating with a coating thickness of 85 nm yields an intensity contribution which equals the intensity contribution 59 of FIG. 11. The transmission obtained for the central ray 57 amounts to approximately 0.967. The transmission obtained for the marginal rays 58 amounts to approximately 0.98. This 85 nm-transmission coating may be used for the two edge strips 64.

FIG. 14 also shows coating thicknesses for transmission coatings of the variation coating 55. A transmission coating with a coating thickness of 68 nm yields a transmission of approximately 0.992 for the central ray 57 and a transmission of 0.99 for the marginal rays 58. (cp. intensity contribution 67). In this case, the transmission of the central beam is thus higher than that of the marginal beams. This may prove useful for an alternative second raster arrangement where, in a central strip, the transmission of the central rays exceeds that of the marginal rays whereas the same transmission is obtained for both the marginal and central rays, or a lower transmission is obtained for the central than for the marginal rays, in the edge strips.

FIG. 14 also shows an intensity contribution 68 of a 61 nm coating. This coating provides for a transmission of approximately 0.964 for the central ray and of approximately 0.966 for the marginal rays.

A 89 nm coating has a transmission of approximately 0.946 for the central ray 57 and of approximately 0.966 for the marginal rays. A combination of coatings with the intensity contributions 68 and 69 may thus be used for a raster element having an effect which corresponds to that of the raster element according to FIG. 13 since the intensity contributions 68 and 69 for the marginal rays are virtually the same, with the greatest difference being observed in terms of the central rays. The central strip 65 of the second raster arrangement 16 may for example be provided with the 61 nm coating yielding the intensity contribution 68, while the edge strips 64 may be provided with the 89 nm-transmission coatings yielding the intensity contributions 69.

Instead of different transmission coatings 56, 60, 62 of the variation coating 55 having an effect on the transmission, the variation coating 55 may also be provided with correspondingly different phase coatings generating various levels of influence on the phases of the illumination light bundle in the various channels of the raster module 13. Coatings influencing the phases to different extents may again be used in portions of, for example, the second raster arrangement 16, as it is described by the example of FIG. 13.

The variation coating 55 may also be applied on the first raster arrangement 12. In this case, the variation coating 55 can be applied on the side of the first raster arrangement 12 facing the second raster arrangement 16. Alternatively, it is also conceivable to apply partial coatings of the variation coating both on the first raster arrangement 12 and on the second raster arrangement 16 whose optical effects are combined to obtain the total effect of the variation coating 55.

Finally, it is conceivable to apply the variation coating only on some portions of the raster arrangements 12, 16 of the raster module 13 so as to generate a defined optical effect depending on the point of incidence whereas in the non-coated portions, no point-of-incidence dependent effect is to be obtained.

Instead of subdividing for example the second optical raster arrangement 16 into five strips 64, 66, 65, 66, 64 with different optical effects, another type of subdivision may be chosen, too. In particular an optical effect which continuously varies in a direction perpendicular to the scanning direction y, i.e. in the x-direction, may be chosen so as to provide for smooth instead of gradual transitions, for example, between a central strip 65 and adjacent strips with regard to their optical effect on the illumination intensity across the illumination field. A subdivision into, for example, two strips, three strips, four strips or more than five strips is also conceivable. The relative width of the strips with regard to each other may vary, too.

Therefore, the central strip 65 may be narrower as compared to the edge strips 64, 66 than illustrated in the example according to FIG. 13. The illumination of each field point of the illumination field 3 as a function of the x-coordinate may be described by a characteristic quantity E(x) which is a measure for the uniformity of the illumination from different illumination angles. This quantity is a function of the intensities $1_Q$ integrated over four quadrants $Q_1$ to $Q_4$ of the second raster arrangement 16 and is defined as follows:

$$E(x)=((I_{Q1}(x)+I_{Q3}(x))/(I_{Q2}(x)+I_{Q4}(x))-1)\times 100\%$$

The quantity E(x) is also referred to as ellipticity.

The above-described device providing additional optical effects may be designed in a way that the ellipticity E(x) varies less than +/−1% in the x-direction across the object field 3.

Figure 15:
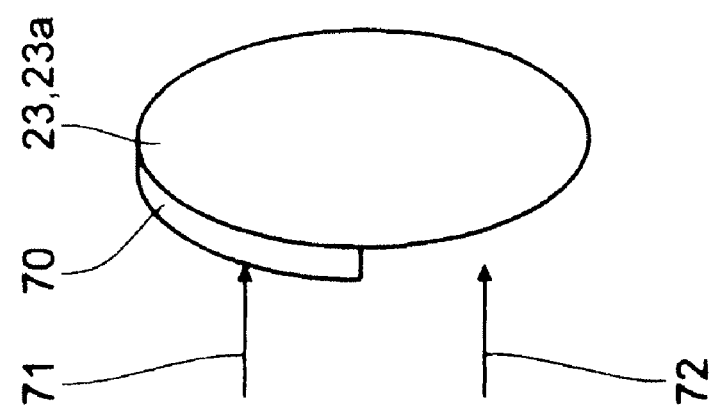
FIG. 15 shows an enlarged view of a raster element of the raster module provided of an optical coating.

FIG. 15 shows a coating 70 applied on a raster element 23 or 23a, respectively, of the raster module 13. The variation coating is only applied on one half of the incident-side surface of the raster element 23, 23a, thus allowing a first partial beam 71 hitting the raster element 23, 23a to pass through the variation coating 70. A second partial beam 72 of the illumination light beam 8, however, hits the raster element 23, 23a in an uncoated area of the incident-side surface. The variation coating 70 is designed as an anti-reflection coating for the wavelength of the illumination light 8. Accordingly, the first partial beam 71 passes through the variation coating 70 and the following incident surface of the raster element 23, 23a virtually without any losses, whereas reflection causes the radiation power of the second partial beam 72 to be reduced by for example 4%.

Figure 16:
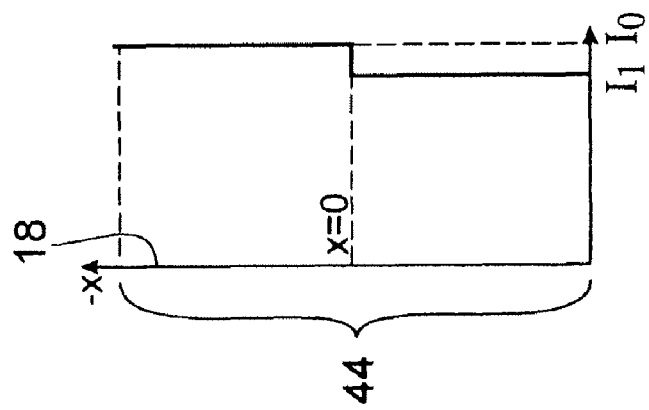
FIG. 16 shows a partial representation, similar to that of FIG. 11, of the effect of a raster element provided with a coating.

FIG. 16 illustrates the effect of the variation coating 70 across the illumination field 44. From the centre of the illumination field 44 (x=0) in FIG. 16 towards the top, both the illumination light beam 8 and the first partial beam 71 have passed through the variation coating 70, thus causing the illumination field 44 to be illuminated with an intensity $I_0$ via the channel which is assigned to the raster element 23, 23a provided with the variation coating 70. Below x=0 in FIG. 16, the illumination field 44 is illuminated with light rays of the illumination light 8 via the channel of the raster element 23, 23a provided with the variation coating 70, the light rays being subject to reflection losses due to their passing through the uncoated portion of the incident-side surface of the raster element 23, 23a. Illumination of the lower half of the illumination field 44 in FIG. 16 via this channel thus takes place at an intensity $I_1$ to which approximately applies: $I_1=0.96 \times I_0$. This simply designed variation coating 70 thus allows to generate an illumination distribution which varies across the illumination field 44. The variation coating 70 may of course also be applied on the emission side of the raster elements 23, 23a. Moreover, variation coatings according to the coating 70 applied on both the incident and emission side may complement each other in terms of their field-depending effects.

Figure 17:
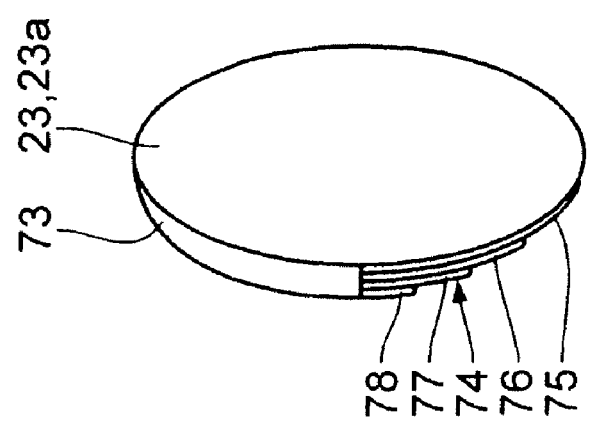
FIG. 17 shows a representation, similar to that of FIG. 15, of an optical coating.

FIG. 17 shows coatings. Variation coating 73, is shown on a raster element in the upper half of FIG. 17. This raster element may again be configured as one of the raster elements 23 or 23a, respectively. The variation coating 73 has a varying coating thickness depending on the point of incidence on the raster element 23, 23a. The coating thickness of the variation coating 73 is the greatest in the centre of the raster element 23, 23a. The coating thickness of the variation coating 73 decreases towards the edge. Accordingly, the illumination light 8 transmitted by the variation coating 73 varies from the centre towards the edge. Moreover, the coating thickness of the variation coating 73 may be designed in a way as to obtain the greatest variation in an annular portion around the centre of the raster element 23, 23a, with the variation continuously decreasing towards the centre of the raster element 23, 23a on the one hand and towards the edge of the raster element 23, 23a on the other hand. Consequently, depending on this transmission variation which is caused by the variation coating 73, a field-dependent intensity variation corresponding to the above description of FIG. 11, for example, is obtained which is caused by the channel assigned to this raster element 23, 23a.

The lower half of FIG. 17 shows a variation coating 74. This variation coating has a layer sequence which varies depending on the point of incidence of the illumination light 8 on the raster element 23, 23a. The variation coating has a layer sequence with a first base layer 75 which is to be applied on the entire incident surface of the raster element 23, 23a. A first intermediate layer 76 is applied on the base layer 75 in a way that it does not quite reach the edge of the raster element 23, 23a, thus resulting in an annular portion on the edge of the raster element 23, 23a on which only the base layer 75 is applied. The first intermediate layer 76 carries a second intermediate layer 77 which again does not reach the edge of the first intermediate layer 76, thus resulting in an annular portion of the raster element 23, 23a beyond the edge of the second intermediate layer 77 on which only the base layer and the first intermediate layer 76 are applied. The second intermediate layer 77 is provided with a top layer 78 in a central portion of the raster element 23, 23a. Again, this top layer 78 does not reach the edge of the second intermediate layer 77, thus resulting in an annular portion of the raster element 23, 23a beyond the edge of the top layer 78 on which the base layer 75 as well as the first and second intermediate layers are applied. The layers 75 to 78 have the same layer thickness. This layer thickness is adapted to the wavelength of the illumination light 8 in a way that depending on whether the illumination light 8 desirably passes through one, two, three or four layers 75 to 78 of the variation coating 74, the transmission of the illumination light 8 varies to different extents. A maximum transmission may be obtained in the area of the top layer 78, for example, and decrease gradually towards the area of the base layer 75. The transmission distribution may also be the other way around, with a maximum transmission being obtained in the edge areas and a minimum transmission being obtained in the central area of the top layer 78. Finally, the variation coating 74 may also have a transmission distribution in which a maximum transmission is obtained in the area of one of the intermediate layers 76, 77, with the transmission decreasing both towards the edge and the centre of the raster element 23, 23a. The variation coating 74 includes a total of four individual layers 75 to 78. Another number of individual layers is conceivable, too. For example, two or three or more than four individual layers may be provided, such as 5, 10 or considerably more individual layers, such as 50 or 100 individual layers. The individual layers may be designed in a step-like manner in the direction towards the edges, as shown at the bottom of FIG. 17. Alternatively, a continuous transition in the edge areas of the individual layers towards the carrier layer underneath is conceivable, too, thus resulting in a correspondingly continuous transmission in terms of the transmission distribution. The respective design of the transitions allows to obtain a gradual transmission distribution, a gradual transmission distribution with continuous transitions or, if a correspondingly large number of individual layers is provided, a completely continuous transition distribution.

In general, as long as they are assigned to individual raster elements on a 1:1 basis, the above-described various embodiments of optical elements provided with an optically coated spatial optical structure may be designed for individual raster elements 23, 23a, for a multitude of raster elements 23, 23a, in particular in coherent areas of the raster module 13, or for all raster elements 23, 23a.

FIGS. 18 to 22 show a projection exposure apparatus 81 with optical elements for presetting an influence exerted on a nominal beam angle, the influence being preset over a beam cross-section of an illumination light beam 8. Components and reference quantities which correspond to those described previously with reference to the FIGS. 1 to 17 carry the same reference numerals and are not described again. Except for the optical coatings of diffractive optical elements, according to FIGS. 18 to 22 corresponds to an illumination system which is described in DE 195 20 563 A1. Just as the projection exposure apparatus 1, the projection exposure apparatus 81 may be configured as a wafer stepper or a wafer scanner.

A KrF excimer laser with a wavelength of 248 nm is used as the light source 6 in the projection exposure apparatus 81. The beam expansion optics 7 of the projection exposure apparatus is a mirror arrangement as described in, for example, DE 41 24 31 1. This mirror arrangement serves to reduce the coherence and to increase the beam cross-section of the illumination light beam 8 so as to obtain a rectangular beam with side lengths of 35±10 mm and 10±5 mm.

A diffractive optical raster element (DOE) 82 is provided in the object plane of an objective 83, with a second diffractive optical raster element (DOE) 84 being disposed in the emission pupil of the objective 83. The function of the DOE 82 corresponds to that of the DOE 9 of the projection exposure apparatus 1 according to FIG. 1. The function of the DOE 84 corresponds to that of the raster module 13 of the projection exposure apparatus 1 according to FIG. 1. The DOE 82 is provided with an optical coating 82a on its emission side. The DOE 84 is provided with an optical coating 84a on its emission side.

The objective 83 is an expanding zoom objective with lenses 85, 86 in a Galilei-telescope arrangement and an integrated axicon pair 87 disposed between the lenses 85, 86. The focal length of the objective 83 is in the range of 600 mm to 2.000 mm, thus allowing a zoom of more than a factor of 3. The DOE 84 may thus be illuminated with cross-sections of the illumination light beam 8 that differ by a factor of 3, thus allowing to generate conventional illuminations with fill factors $0.3<\sigma<0.9$ via the illumination system 5 of the projection exposure apparatus 81. The diameter of the illumination light beam 8 in the DOE 84 then reaches values of for example between 50 mm and 100 mm.

Moreover, it is possible to obtain adjusted annular aperture illuminations by changing the distance between the elements of the axicon pair 87. If the axicon elements are not configured as rotation-symmetric conical surfaces but for example as pyramidal surfaces or surfaces having another symmetry than order four, quadrupole or other multipole illuminations may be generated.

The DOE 82 leads to a divergence of approximately 1.43° (NA=0.025) of the channel-by-channel illumination light bundles of the illumination light beam 8. The numerical aperture on the incident side of the objective 83 is adapted to this divergence. The optical coating 82a provides for the marginal rays of the illumination light beam 8 to have a beam angle distribution of a uniform intensity over the beam cross-section after passing through the DOE 82. In this case, the effect of the optical coating 82a is a combination of the plateau effect as described above in conjunction with the FIGS. 3 to 5 and of the bandpass effect as described above in conjunction with the FIGS. 6 and 7.

Depending on its design, the DOE 84 generates a divergence of the incident bundle of between 0.5° and 7°. In this regard, the divergence effect is an anamorphotic one, with an aspect ratio of other than 1 between perpendicular main planes. In this regard, the plateau and bandpass effects of the coating 84a correspond to those of the coating 82a of the DOE 82.

A coupling optics 88 disposed downstream of the coated DOE 84 transmits the illumination light beam 8 on an incident surface 89 of a glass bar 90. The function of the coupling optics 88 corresponds to that of the condenser 17 of the illumination system 5 according to FIG. 1. The glass bar 90 mixes and homogenizes the illumination light beam 8 by multiple internal reflections. An intermediate field plane 92 is disposed directly adjacent to an emission side 91 of the glass bar 90. A reticle masking system (REMA) 93 is disposed in this intermediate field plane 92. The latter is a movable field diaphragm. The opening of the REMA 93 and the cross-section of the glass bar 90 are exactly adapted to the shape of the illumination field 3 of the projection exposure apparatus 81. The REMA 93 is followed by an objective 94 in the beam path of the illumination light beam 8. The objective 94 images the intermediate plane 92 into the reticle plane 4.

The objective 94 has groups of lenses 95, 96, 97, a deviation mirror 98 disposed downstream thereof and another group of lenses 99 disposed downstream thereof. The two diffractive optical elements 82, 84 with the coatings 82a, 84a, together with the optical components disposed upstream of the glass bar 90, are designed in a way as to obtain a high-efficiency illumination as homogeneous as possible of the incident surface 89. The first DOE 82, which serves as pupil-defining element (PDE) together with the optical coating 82a, changes the divergence of the illumination light beam 8, via a preset amount of influence on the beam angle, in a way that depending on the desired illumination setting, an approximate circular, annular, dipole, quadrupole or another multipole distribution is obtained at the position of the second DOE 84.

The second DOE 84 with the optical coating 84a leads to a divergence of some angular degrees via a corresponding amount of influence on the beam angle of the illumination light beam 8. The effect of the second DOE 84 is anamorphic to such an extent that a divergence is generated whose aspect ratio equals the aspect ratio of the incident surface 89 of the glass bar 90. Such an aspect ratio may amount to 1:1.3, for example. The beam angle or divergence distribution, respectively, generated by the second DOE 84 with the optical coating 84a in the pupil plane where the second DOE 84 is disposed in is converted into a field distribution which exactly equals the shape and size of the incident surface 89. The second DOE 84 with the optical coating 84a, together with the glass bar 90, thus serves as a field-presetting element (FDE).

Figure 19:
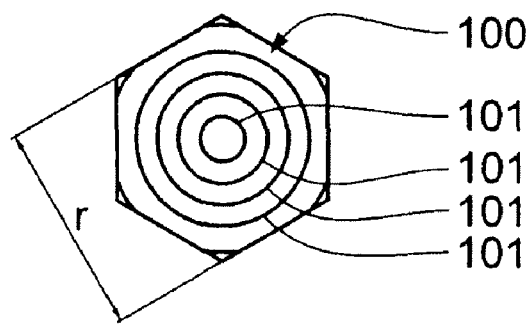
FIG. 19 shows a schematic plan view of a raster element of a first diffractive optical element of the illumination system according to FIG. 18.
Figure 20:
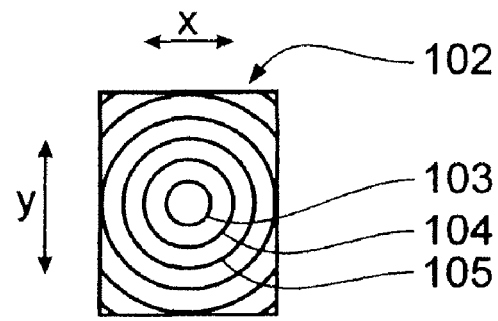
FIG. 20 shows a schematic plan view of a raster element of a second diffractive optical element of the illumination system according to FIG. 18.

FIG. 19 shows a configuration of an individual raster element 100 of the first DOE 82. The raster element 82 is hexagonal and has a typical side-to-side distance of r=1 mm. The raster elements 100 are arranged in a honeycomb manner to form the two-dimensional DOE 82. At this side-to-side distance r and the laser wavelength lambda=248 nm, a diffraction pattern generated by the first DOE 82 has a periodicity lambda/r of $2.48 \cdot 10^{-4}$, corresponding to a periodicity diffraction angle of 0.014°. Since the illumination light beam 8 passing through the first DOE 82 has a coherence of less than 1 mm and a divergence on the emission side which is increased by magnitudes, disturbances due to interferences are thus avoided. The illumination light bundles of the illumination light beam 8, which are assigned to the individual raster elements 100, i.e. the channels of the first DOE 82, thus do not disturb one another.

The raster element 100 is configured as a diffractive concave Fresnel lens. The raster element 100 has eight annular stages 101 four stages of which are shown in FIG. 19. Each of the stages has a thickness of $(\pi/4)$ lambda in the beam direction of the illumination light beam 8. All raster elements 100 of the DOE 82 are designed in the same way. Alternatively, the structures of coherent areas of the DOE 82 may also be designed with Fresnel lenses of different diffractive effects. The raster elements 100 are produced through photo-lithography and subsequent etching.

The raster element 100 converts a collimated incident illumination light bundle into a divergent light bundle with a divergence angle of 1.43°. The numerical aperture of the raster element 100 thus amounts to 0.025. A multitude of the raster elements 100 are arranged to form the DOE 82 which covers the entire cross-sectional area of the incoming illumination light beam 8. The diffraction efficiency of the DOE 82 exceeds 80%. Due to the combined far field effect generated by the DOE 82 and the optical coating 82a, the radial intensity distribution arriving at the position of the second DOE 84 in the case of a conventional illumination setting of the objective 94 corresponds very closely to a rectangular function.

The second DOE 84 is configured as a disc with a diameter of 50 to 100 mm. The second DOE 84 has an anamorphic effect. It is composed of two-dimensional, i.e. arranged in rows and columns, adjacent rectangular raster elements 102 with an internal rotation-symmetric structure, with one of which being shown in a schematic plan view in FIG. 20. The rectangle-side ratio x/y of the raster element 102 equals the x/y aspect ratio of the incident surface 89 of the glass bar 90 and the surface of the reticle illuminated in the reticle plane 4. The exemplified embodiment shown in FIG. 20 has a side ratio x/y of 1.5 mm/2 mm for each raster element 102. Due to these dimensions of the raster elements 102 and corresponding to the above description in terms of the raster elements 100, a disturbance between adjacent illumination light bundles of the illumination light beam 8, which pass through the DOE 84, is impossible.

Figure 21:
FIG. 21 shows a phase profile of the raster element according to FIG. 20.

The raster elements 102 are also diffractive Fresnel lenses with a negative focal length of typically −10.5 mm. These Fresnel lenses are designed as grey-shade lenses with a thickness distribution whose cross-section is shown in FIG. 21. The thickness of each annular stage 103, 104, 105 of the raster element 102 varies by an amount of (6π)·Lambda. FIG. 21 shows a cross-section through the raster element according to FIG. 20 in the x-direction. The divergence generated by the individual raster element 102 is 0.5° to 7°, depending on the focal length of the Fresnel lens and on the effect of the optical coating 84a, with an x/y aspect ratio which equals the aspect ratio of the incident surface 89 of the glass bar 90. At an x/y aspect ratio of 1/1.3, the divergence in the x-direction as compared to the y-direction is increased by a factor of 1.3. For example, a divergence of 6.5° may occur in the x-direction, and a divergence of 5° in the y-direction.

Figure 22:
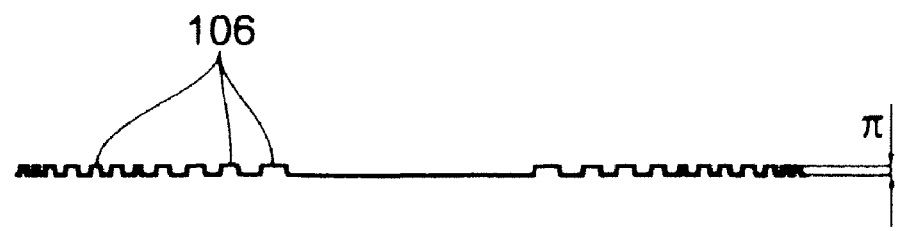
FIG. 22 shows a phase profile of a binary diffractive optical element which may replace the raster elements according to FIGS. 19 and 20.

Alternatively, the raster elements 100, 102 may be designed as binary diffractive phase profile lenses, as shown by the cross-section of FIG. 22. In this case, annular webs 106 with a uniform height of π Lambda but various web thicknesses and various distances between adjacent webs 106 are provided as diffractive structures.

Figure 18:
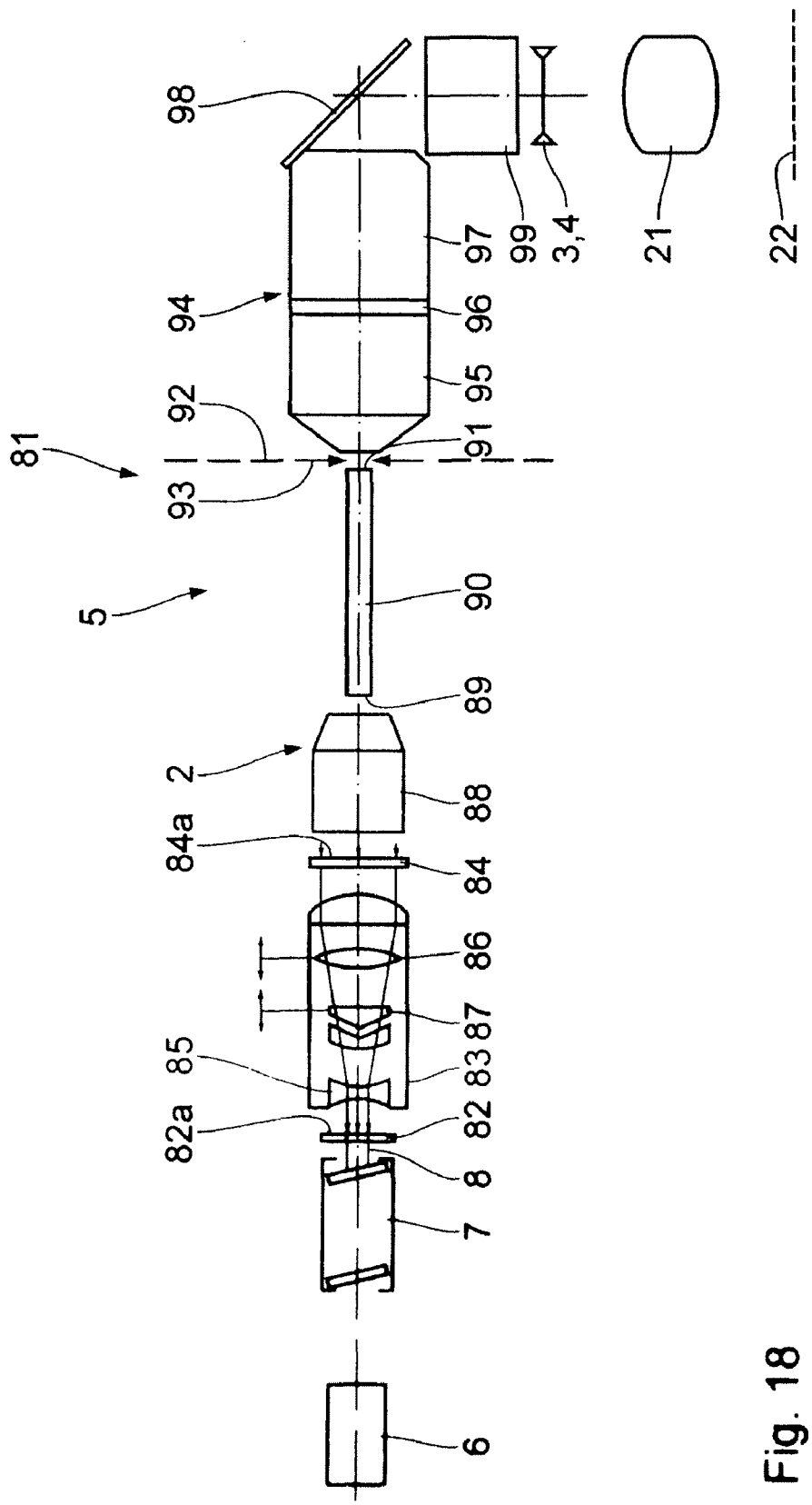
FIG. 18 shows a schematic meridional section of another illumination system in a projection exposure apparatus for the microlithography.

The effect of the second DOE 84, in conjunction with the optical coating 84a, is such that a homogeneous intensity distribution is obtained in the incident surface 89 of the glass bar 90 of the arrangement according to FIG. 18. The function of this intensity distribution in both x- and y-direction is approximately rectangular, with a partially constant plateau area and a high edge steepness.

Refractive lens rasters may be used as an alternative to the diffractive optical raster elements 100, 102, as described above with regard to the raster arrangements 12, 16.

The raster elements 23, 23a, 100, 102 may be designed in a self-supporting manner or applied on a carrier layer. The optical coating 24, 24', 55, 82a, 84a may be applied on the raster elements themselves or on the carrier layer. As long as the optical structure is only applied on one side of the raster element, i.e. on the incident or on the emission side, the optical coating may be provided on the same side or on the opposite side, or two optical coatings with complementing optical effects may be provided on the incident and emission side. Principally, it is also conceivable to apply the diffractive or refractive spatial optical structures on both the incident and emission side of the respective raster element.

Generally, the optical coatings 24, 24', 55, 82a, 84a on the raster elements generate a maximum attenuation and a minimum attenuation—depending on the respective point of incidence on the raster elements—of each illumination light bundle of the illumination light beam 8 when hitting the respective raster element. The difference in attenuation between adjacent raster elements, provided that there is such a difference, is generally small as compared to the difference between the maximum and minimum attenuation generated by an individual raster element. Variations of the optical characteristics of the raster elements across the raster arrangements are therefore kept to a minimum across coherent areas. Between adjacent portions of the raster arrangements, for example between the strips 64 to 66 of the raster arrangement 16 according to FIG. 13, however, there may be sharp transitions and large differences between the optical characteristics of the raster elements.

What is claimed is:

1. An optical element, comprising:
   a spatial optical structure configured to influence a nominal beam angle of a radiation beam when the spatial optical structure is exposed to the radiation beam; and
   an optical coating supported by the spatial optical structure, the optical coating being configured to generate a defined attenuation of parts of the radiation beam over a beam cross-section when exposed to the radiation beam, thereby influencing the nominal beam angle of the radiation beam,
   wherein optical effects of the spatial optical structure and the optical coating complement each other in influencing the nominal beam angle of the radiation beam, and
   wherein the optical coating is designed so that beam angles generated by the spatial optical structure that exceed a divergence angle limit are absorbed or reflected by the optical coating.

2. The optical element according to claim 1, wherein the spatial optical structure has a diffractive effect on the radiation beam.

3. The optical element according to claim 1, wherein the spatial optical structure has a refractive effect on the radiation beam.

4. The optical element according to claim 1, wherein the optical coating is an interference coating.

5. The optical element according to claim 1, wherein the spatial optical structure comprises a plurality of raster elements.

6. The optical element according to claim 5, wherein:
   the optical coating is configured to cause a maximum attenuation of the radiation beam at a first point of incidence on one of the raster elements and a minimum attenuation of the incident radiation beam at a second point of incidence on the same raster element; and
   a difference in attenuation between adjacent raster elements is less than a difference between the maximum and minimum attenuation.

7. The optical element according to claim 1, wherein the optical coating is designed to generate an attenuation to correct the influence on the beam angle exerted by the spatial optical structure.

8. The optical element according to claim 1, wherein:
   the spatial optical structure is designed to generate a far field distribution for the incident radiation beam;
   a first intensity is generated at a first position of the far field;
   a second intensity is generated at a second position of the far field;
   the first and second intensities differ by at least 5%; and
   the optical effect of the optical coating and the optical effect of the spatial optical structure complement each other so that the total far field distribution generated by the optical element is constant in at least a portion comprising the first and second positions.

9. An optical system, comprising:
   an optical element according to claim 1,
   wherein the optical system is a microlithography illumination optics.

10. The optical system of claim 9, wherein the optical element is configured to set an angular distribution of an intensity of illumination light in a reticle plane.

11. The optical element of claim 9, wherein the optical element is configured to set a field distribution of an intensity of an illumination light in a reticle plane.

12. An optical system, comprising:
a light source; and
an illumination optics comprising the optical element of claim 1,
wherein the optical system is microlithography illumination system.

13. The optical system of claim 12, wherein the optical element is configured to set an angular distribution of an intensity of illumination light in a reticle plane.

14. The optical element of claim 12, wherein the optical element is configured to set a field distribution of an intensity of an illumination light in a reticle plane.

15. An optical system, comprising:
an optical element of claim 1,
wherein the optical system is a microlithography projection exposure apparatus.

16. The optical system of claim 15, comprising an illumination optics comprising the optical element.

17. The optical system of claim 16, comprising an illumination system comprising the illumination optics.

18. The optical system of claim 17, further comprising a projection objective.

19. An optical element, comprising:
a spatial optical structure configured to influence a nominal beam angle of a radiation beam when the spatial optical structure is exposed to the radiation beam; and
an optical coating supported by the spatial optical structure, the optical coating being configured to generate a defined attenuation of parts of the radiation beam over a beam cross-section when exposed to the radiation beam, thereby influencing the nominal beam angle of the radiation beam,
wherein optical effects of the spatial optical structure and the optical coating complement each other in influencing the nominal beam angle of the radiation beam, and
wherein the optical coating is designed so that beam angles generated by the spatial optical structure that are below a divergence angle limit are reflected by the optical coating.

* * * * *

UNITED STATES PATENT AND TRADEMARK OFFICE
CERTIFICATE OF CORRECTION

| | |
|---|---|
| PATENT NO. | : 8,411,251 B2 |
| APPLICATION NO. | : 12/413170 |
| DATED | : April 2, 2013 |
| INVENTOR(S) | : Michael Gerhard |

It is certified that error appears in the above-identified patent and that said Letters Patent is hereby corrected as shown below:

On the Title Page

Item (63) Col. 1 (Related U.S. Application Data),
Line 2, Delete "Dec. 20, 2007." and insert --Dec. 20, 2007, and is a continuation-in-part of PCT/EP2007/001362 filed on Feb. 16, 2007.--

In the Drawings

Sheet 7 of 10 (FIG. 14)
Line 2, delete "Unifomity" and insert --Uniformity--

In the Specifications

Column 12,
Line 48, delete "$l_Q$" and insert --$I_Q$--

In the Claims

Column 19,
Line 8, after "is" insert --a--

Signed and Sealed this
Fourth Day of June, 2013

Teresa Stanek Rea
*Acting Director of the United States Patent and Trademark Office*